(12) United States Patent
Lawrence et al.

(10) Patent No.: US 8,945,307 B2
(45) Date of Patent: Feb. 3, 2015

(54) APPARATUS AND METHOD FOR VAPOR DEPOSITION OF DIELECTRIC WIRE COATING

(75) Inventors: Thomas Lawrence, Indianapolis, IN (US); Nick Stahl, Indianapolis, IN (US); Jay Ahling, Firestone, CO (US)

(73) Assignee: AeroQuest Research Group LLC, Indianapolis, IN (US)

( * ) Notice: Subject to any disclaimer, the term of this patent is extended or adjusted under 35 U.S.C. 154(b) by 818 days.

(21) Appl. No.: 12/977,837

(22) Filed: Dec. 23, 2010

(65) Prior Publication Data

US 2011/0151111 A1 Jun. 23, 2011

Related U.S. Application Data

(60) Provisional application No. 61/289,994, filed on Dec. 23, 2009.

(51) Int. Cl.
| | |
|---|---|
| *B05D 5/12* | (2006.01) |
| *C23C 16/458* | (2006.01) |
| *B05D 7/14* | (2006.01) |
| *B05D 1/00* | (2006.01) |
| *C23C 14/12* | (2006.01) |
| *C23C 14/50* | (2006.01) |
| *C23C 14/54* | (2006.01) |

(52) U.S. Cl.
CPC .. *B05D 7/14* (2013.01); *B05D 1/60* (2013.01); *C23C 14/12* (2013.01); *C23C 14/50* (2013.01); *C23C 14/54* (2013.01); *B05D 2256/00* (2013.01)
USPC ........... 118/718; 118/722; 118/728; 427/117; 427/118

(58) Field of Classification Search
USPC ........... 118/722, 718, 728, 729; 427/118, 117
See application file for complete search history.

(56) References Cited

U.S. PATENT DOCUMENTS

| | | | |
|---|---|---|---|
| 4,176,209 A | 11/1979 | Baker | |
| 4,846,998 A | 7/1989 | Pohl et al. | |
| 4,886,923 A | 12/1989 | Ungarelli et al. | |
| 5,210,341 A | 5/1993 | Dolbier, Jr. et al. | |
| 5,284,933 A | 2/1994 | Dobeli et al. | |
| 5,302,767 A | 4/1994 | Galley et al. | |
| 5,310,858 A | 5/1994 | Greiner et al. | |
| 5,536,892 A | 7/1996 | Dolbier, Jr. et al. | |
| 5,538,758 A | 7/1996 | Beach et al. | |
| 5,556,473 A | 9/1996 | Olson et al. | |

(Continued)

FOREIGN PATENT DOCUMENTS

JP 9025252 1/1997

OTHER PUBLICATIONS

Written Opinion of the International Searching Authority issued in PCT Patent Application Serial No. PCT/GB2005/003843, 9 pages.

(Continued)

*Primary Examiner* — Sylvia R MacArthur
(74) *Attorney, Agent, or Firm* — Lathrop & Gage LLP

(57) ABSTRACT

Embodiments of the invention involve a technique and process for coating fine diameter, single strand wire of long continuous lengths with Parylene. The special fixture design and process allows for ultra thin (as thin as 0.2 micron), pore free, coatings. The advantages of this technology allow for wire products that offer minimal intrusion, superior routing and winding characteristics, and high heat and chemical resistance. The coating process can also be used for other types of material.

9 Claims, 9 Drawing Sheets

(56) References Cited

U.S. PATENT DOCUMENTS

| | | |
|---|---|---|
| 5,841,005 A | 11/1998 | Dolbier, Jr. et al. |
| 5,849,962 A | 12/1998 | Dolbier, Jr. et al. |
| 5,908,506 A | 6/1999 | Olson et al. |
| 6,130,096 A | 10/2000 | Tinker et al. |
| 6,150,499 A | 11/2000 | Dolbier, Jr. et al. |
| 6,392,097 B1 | 5/2002 | Dolbier, Jr. et al. |
| 6,646,150 B1 | 11/2003 | Sato et al. |
| 6,869,698 B2 | 3/2005 | Chen et al. |
| 7,462,750 B2 | 12/2008 | Hanefeld et al. |
| 2002/0026086 A1 | 2/2002 | Dolbier, Jr. et al. |
| 2007/0148390 A1 | 6/2007 | Kumar |
| 2007/0228606 A1 | 10/2007 | Hanefeld et al. |
| 2011/0151111 A1* | 6/2011 | Lawrence et al. ............ 427/118 |

OTHER PUBLICATIONS

Shiori, Takayuk, Matsuura, Fumiyoshi, and Hamada, Yasumasa, "Use of the aryl groups as the carboxyl synthon. Application to the synthesis of some natural products containing hydroxy amino acid functions", Pure & Appl. chem., vol. 66, Nos. 10/11, pp. 2151-2154, 1994.

International Search Report issued Sep. 26, 2007, in PCT Patent Application Serial No. PCT/GB2005/003843, 2 pages.

\* cited by examiner

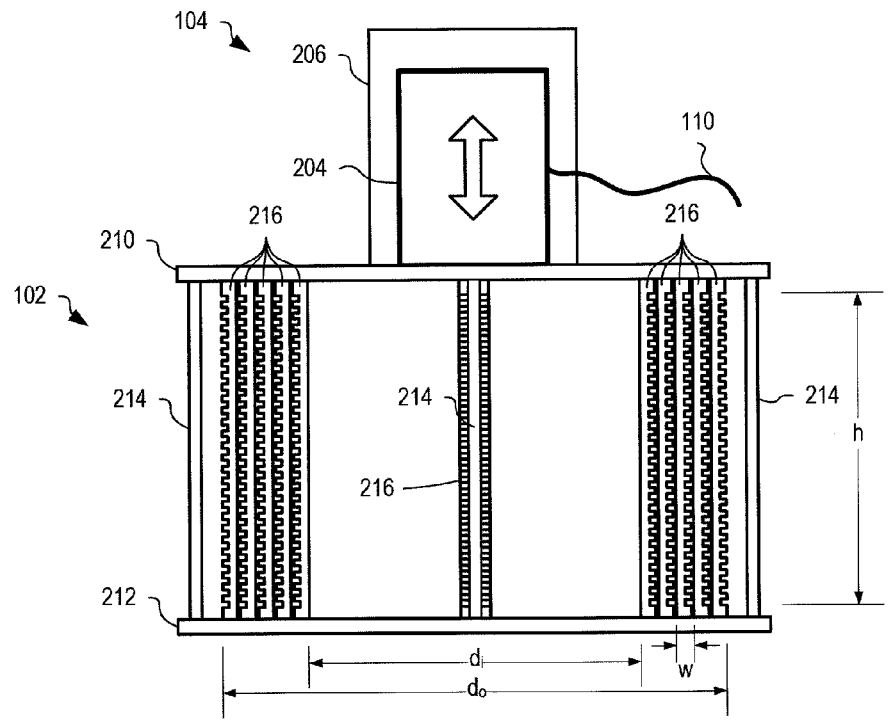
FIG. 2
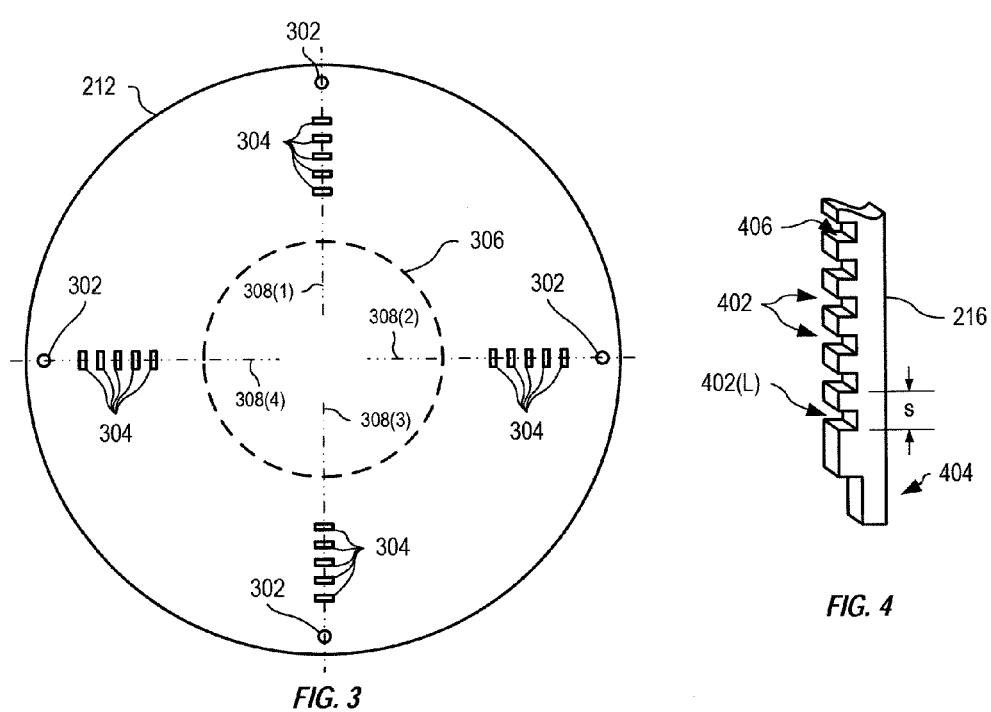
FIG. 3
FIG. 4

APPARATUS AND METHOD FOR VAPOR DEPOSITION OF DIELECTRIC WIRE COATING

RELATED DOCUMENTS

This application claims priority to U.S. Patent Application Ser. No. 61/289,994, titled "Apparatus and Method for Vapor Deposition of Dielectric Wire Coating", filed Dec. 23, 2009, and incorporated herein by reference. U.S. Pat. No. 7,462,750, titled "Parylene variants and methods of synthesis and use," is incorporated herein by reference.

STATEMENT OF FEDERALLY SPONSORED RESEARCH

The invention was developed as a result of work on an SBIR/STTR project called "Development of a High Speed High Temperature Slip Ring" conducted by Aerodyn Engineering, Inc.

TECHNICAL FIELD OF THE INVENTION

This invention relates to a fixture and process for coating small diameter wire with a thin dielectric material that can withstand very high temperature exposure. In particular, the fixture and process allows for long lengths of wire to be batch coated with the dielectric material in a high vacuum chamber. The result is wire products with a very thin insulator that can withstand temperatures far beyond the thermal capabilities of current available products.

BACKGROUND

Small size insulated wire is commonly called magnet wire since it used most often in winding for electromagnets and generators. It is also used to make electronic components such as inductors and transformers. In addition, it is used for lead wires in instrumentation and related applications. To be used in these applications, there are a number of properties the wire must possess: it must be small, pliable for routing and winding, and well insulated from electrical contact. In addition, it is advantageous if the wire can survive high temperatures as this often allows more efficient and economical designs. In some cases, a degree of chemical resistance is also required. Where used in weight critical components, such as aircraft generator coils, a thin, electrically insulated wire with high thermal tolerance is required.

Insulating coatings commonly used for magnet wire include extruded PTFE (Polytetrafluoro Ethylene) or Teflon and FEP (Fluorinated Ethylene Propylene) insulation. These insulations only add about 0.0007" to the wire outer diameter (OD), and leave the wire readily pliable for routing or winding. The highest service temperatures for these coatings are 392° F. for FEP and 428° F. for PTFE.

Higher service temperatures (up to 840° F.) can be reached by non-extruded insulating materials, most commonly a wrap of mica tape in fiberglass sheath. Since this combination is permeable to gas, copper conductors are prone to severe corrosion. To avoid this problem, providers of the wire product use strands of nickel clad copper wire. This results in the smallest available wire being 22 AWG with a nominal 0.0253" OD. The addition of the mica wrap and fiberglass braid makes the 22 AWG insulated product diameter grow to 0.071". The smallest mica-fiberglass wire available is 18 AWG, which has a total OD 0.097", and is less pliable and more difficult to route than thinner wires.

Still higher service temperature can be reached by using ceramic insulated wire or manganese oxide insulation inside a metal sheath. However, these insulations have problems as well. The ceramic insulation that is commonly available is porous, so it absorbs any liquids or gasses it contacts. It is also relatively easy to remove from the wire, so caution must be exercised when handling or spooling it. The metal-manganese oxide insulation can withstand extremely high temperature (up to 2000° F. in some cases), however, the use of a comparatively stiff metal sheath makes it extremely difficult to route or spool. It also has a large OD compared to the size of wire it insulates.

It is therefore desirable to find an insulation that can withstand comparatively high temperatures, adds little to the diameter of the wire, is relatively tough, and is nonporous and pliable. Parylene HT is one such insulation material. Parylene HT does not melt, but starts to oxidize at temperatures greater than 450° C. (842° F.) and becomes brittle.

Parylene HT is the trade name for one of a family of polyxylylene polymers of which various members have been sold under the name Parylene since the 1970s. Parylenes are particularly valued for their high dielectric strength, high chemical resistance, low permeability and ability to thoroughly coat small surfaces and enter small spaces. Parylene HT forms very thin and tough coatings and can withstand high temperature, making Parylene HT uniquely suited for insulating magnet wire.

However, Parylene HT requires an exotic application process, wherein the object to be coated is placed in a vacuum chamber and Parylene HT is introduced as a vapor for 6 to 8 hours. Parylene HT cannot therefore be applied to magnet wire using the conventional high volume reel-to-reel wire coating process.

For further information on Parylene HT, see U.S. Pat. No. 7,462,750 of Specialty Coating Systems of Indianapolis, Ind.

SUMMARY OF THE INVENTION

An apparatus and method facilitates vacuum deposition coating of long continuous lengths of small cross-sectional area wire with an extremely thin layer of highly chemical resistant, nonporous dielectric material. A large quantity of wire is wound around the apparatus and placed into a vacuum chamber. The apparatus vibrates within the vacuum chamber such that the wire does not contact the apparatus for any significant length of time, thereby allowing a coating material, introduced into the vacuum chamber in vapor form, to coat substantially the entire surface of the wire.

BRIEF DESCRIPTION OF THE FIGURES

FIG. 2 shows a side view of the actuator and bobbin of FIG. 1, illustrating top and bottom plate, notched struts and threaded rods.

FIG. 3 is a top view of the bottom plate of FIG. 2.

FIG. 4 shows a perspective view of a bottom part of one exemplary notched strut of FIG. 2, illustrating square shaped notches and a spigot for coupling with the bottom plate.

DETAILED DESCRIPTION OF THE FIGURES

Figure 1:
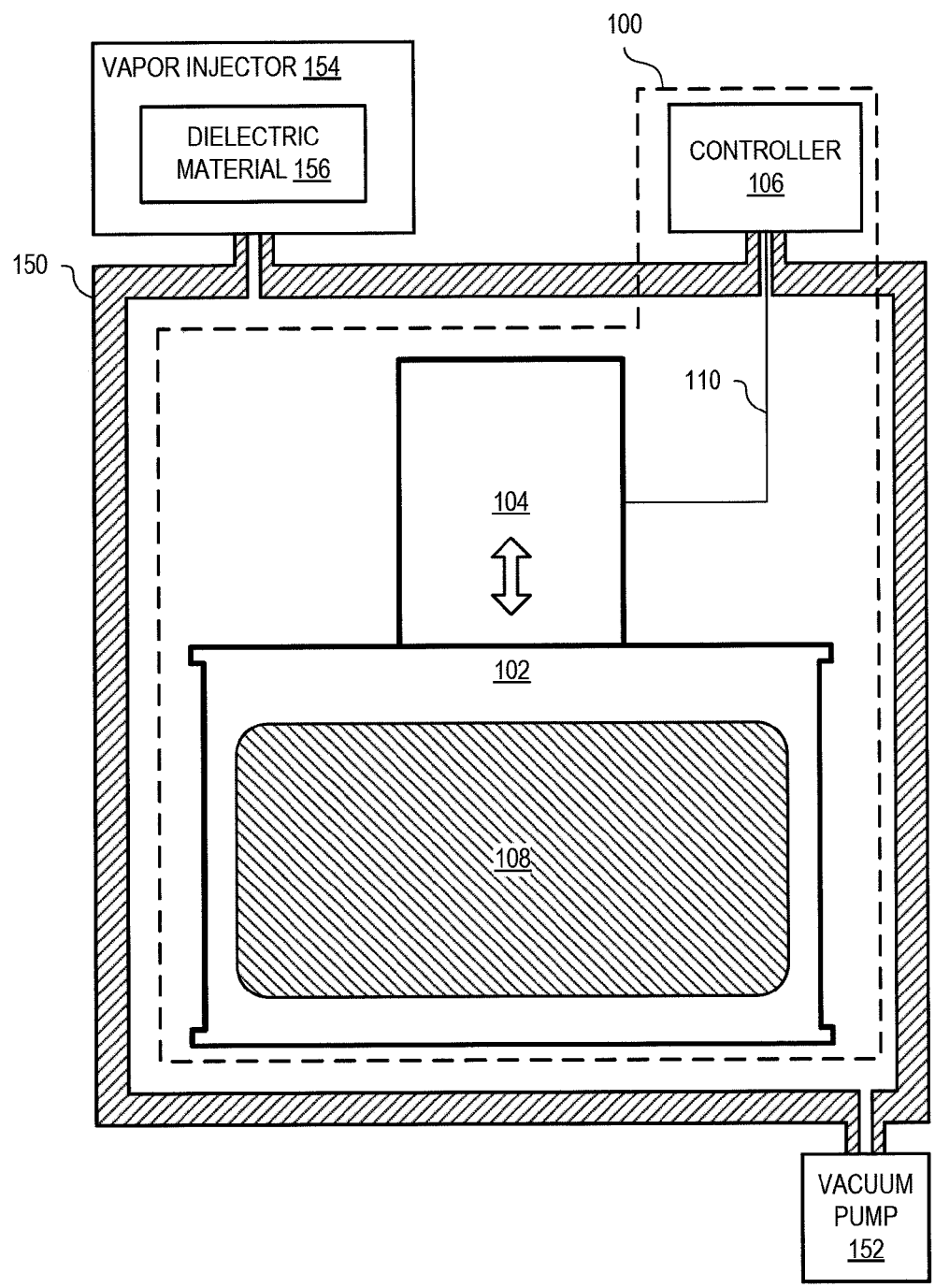
FIG. 1 shows one exemplary apparatus for facilitating vapor deposition of a dielectric wire coating within a vacuum chamber, in an embodiment.

FIG. 1 shows one exemplary apparatus 100 for facilitating vapor deposition of a dielectric material 156 onto a wire 108 within a vacuum chamber 150. Vacuum chamber 150, vacuum pump 152, and vapor injector 154 may represent any one of a LABCOTER® Parylene Deposition System, a PDS 2060PC Deposition System, and a PDS 2035CR Deposition System, made by Specialty Coating Systems of Indiana, or any other such vacuum chamber suitable for vapor deposition of a dielectric material.

Vacuum chamber 150 is for example cylindrical with an internal diameter of 12 inches and an internal length of 12 inches. Vacuum chamber 150 may be formed in other shapes and have other sizes without departing from the scope hereof. Wire 108 is loosely spooled onto a bobbin 102 such that each turn of wire 108 does not contact any other turn of wire 108. Wire 108 may represent any type of wire that benefits from a thin dielectric coating, such as, but not limited to, a magnet wire, sensor wire, and fixture wire. Wire 108 may have any size, but is practically between 15-40 AWG, and be made of any conductive metal or alloy, such as aluminum and copper. Wire 108 may have a cross-section such as circular, elliptical, square, rectangular, or hexagonal.

Bobbin 102 is mechanically attached to an actuator 104 that connects, via an electrical connection 110, to a controller 106. Controller 106 drives actuator 104 to impart a vibration to bobbin 102 such that spooled wire 108 has only momentary physical contact with bobbin 102. Controller 106 is shown external to vacuum chamber 150, but may be located within vacuum chamber 150 without departing from the scope hereof.

Dielectric material 156 may represent a polyxylylene polymer such as Parylene HT, although other dielectric material may be used without departing from the scope hereof. Parylene HT is preferable because of its high dielectric strength, high chemical resistance, low permeability and ability to thoroughly coat small surfaces and enter small spaces.

Wire 108 is loosely spooled onto bobbin 102 and placed within vacuum chamber 150 and a vacuum pump 152 then evacuates chamber 150 to a level of 0.1 Torr or less. Controller 106 drives actuator 104 to vibrate bobbin 102, preferably at a resonant frequency of bobbin 102, such that contact between spooled wire 108 and bobbin 102 is minimized. In particular, bobbin 102 vibrates with a force that exceeds gravity (1 g) such that wire 108 only momentarily contacts bobbin 102. A vapor injector 154 injects dielectric material 156, in vapor form, into vacuum chamber 150 over a coating period while controller 106 maintains vibration of bobbin 102. Dielectric material 156 coats the surface of spooled wire 108. Since spooled wire 108 has, on average, substantially no contact with bobbin 102 (or itself), the entire surface of spooled wire 108 is coated with dielectric material 156.

FIG. 2 shows a side view of actuator 104 and bobbin 102 of FIG. 1. Actuator 104 represents any electrically controlled mechanical actuating device 204, such as one or more Piezo elements, within a housing 206. Electrical connector 110 connects actuating device 204 to controller 106 (not shown in FIG. 2). Bobbin 102 includes a circular top plate 210, a circular bottom plate 212, a plurality of threaded rods 214, and a plurality of notched struts 216. Although each notched strut 216 is shown with twenty-seven notches, more or fewer notches may be used with each strut 216 without departing from the scope hereof. Notched struts 216 are formed into groups that are positioned vertically between bottom plate 212 and top plate 210 such that each notched strut within each group is aligned substantially to a radial of bobbin 102 and adjacent to another notched strut of the group.

FIG. 3 is a top view of bottom plate 212 of FIG. 2, illustrating four exemplary threaded holes 302 for each receiving one threaded rod 214, and four groups of five equally spaced slots 304, each for receiving a spigot of one notched strut 216, that are aligned to four equally spaced radials 308(1)-(4) of bottom plate 212. Top plate 210 is constructed similar to bottom plate 212, having a plurality of slots to accommodate top spigots of notched struts 216 and holes for accommodating threaded rods 214. Slots 304 are spaced such that notched struts 216, when inserted into slots 304, are positioned vertically and without substantial spacing therebetween. That is, with the exception of the outermost notched strut 216 in each radial 308, notches in the struts are closed by an adjacent strut. Although four radials 306 are shown, fewer or more radials may be used without departing from the scope hereof. For example, additional radials may be used where the diameter of wire 108 is smaller, and fewer radials may be used where the diameter is wire 108 is greater. Although five slots 304 (and hence five struts 216) are shown in each radial 308, more or fewer slots (and struts) may be used without departing from the scope hereof.

FIG. 4 shows a perspective view of a bottom part of one exemplary notched strut 216 of FIG. 2, illustrating square shaped notches 402 and a spigot 404 formed on the end. The top end of notched strut 216 is similarly formed with a spigot. Although square shaped notches 402 are shown, notches 402 may have other shapes without departing from the scope hereof. Also, the size of notches 402 may be selected based upon the diameter of wire 108. For example, the larger the diameter of wire 108, the larger each notch 402, and the smaller the diameter of wire 108, the smaller each notch 402. Each notch 402 preferably has a depth and width that is at least twice the diameter of wire 108, thereby providing room within notch 402 for movement of wire 108 resulting from imparted vibration by actuator 104.

Figure 8:
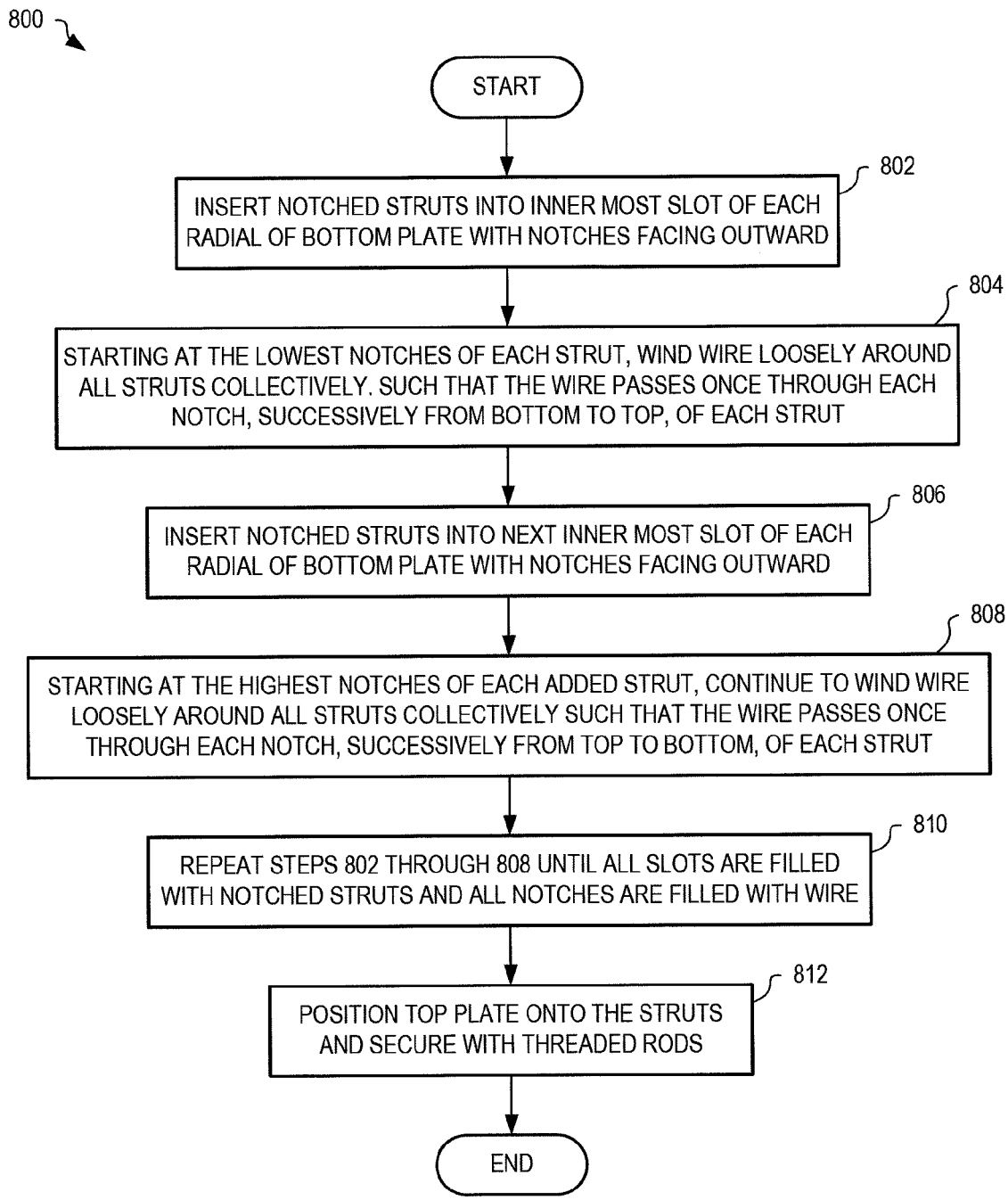
FIG. 8 shows one exemplary method of winding the wire onto the bobbin of FIG. 2, in an embodiment.

FIG. 8 shows one exemplary method 800 of winding wire 108 onto bobbin 102. FIGS. 2, 3, 4 and 8 are best viewed together with the following description. To wind wire 108 onto bobbin 102, bottom plate 212 is detached from threaded rods 214 and notched struts 216, and bottom plate 212 is laid flat. Bottom plate 212 may be placed onto a turntable (not shown) to facilitate winding of wire as described below.

In step 802, four struts 216 are mounted onto bottom plate 212 by inserting the bottom spigot 404 of each strut 216 into an inner most slot 304 of each radial 306 with notches 402 facing outwards. Spigot 404 fits securely into slot 304 such that strut 216 is held in an upright position. In step 804, wire 108 is then loosely wound, starting at the lowest notch, around the inserted struts 216 collectively such that the first turn of wire 108 is located in a lowermost notch 402(L), and wire 108 of subsequent turns is placed in the next higher notch 402 of each strut 216, until all notches 402 have wire 108 passing though once.

In step 806, additional struts 216 are inserted into the next available innermost slot of each radial such that notches 402 of each strut 216 are facing outwards. In step 808, winding of wire 108 continues by passing through the top notches 402 of each newly inserted strut 216, and the next lower notch 402 on subsequent turns until all notches 402 are filled with wire 108.

In step 810, steps 802 through 808 are repeated until all slots in bottom plate 212 are filled with notched struts 216, and each notch 402 of each strut 216 is filled with one turn of wire 108. In step 812, top plate 210 is positioned onto notched struts 216, such that alignment of the struts to bottom plate 212 is maintained, and bottom plate 212 and top plate 210 are secured together with threaded rods 214, thereby also securing notched struts 216 within bobbin 102.

Bottom plate 212 may include a plurality of vibration absorbing feet (not shown) that support bobbin 102 and actuator 104 within vacuum chamber 150 and allow bobbin 102 to vibrate.

A prototype bobbin 102 has a working height of six inches, and working diameter of three inches to six inches with eight rows of notched struts 216, each of which has 40 notches. This prototype bobbin accommodates about 375 feet of continuous wire. It is calculated that 24,500 feet (4.64 miles) of continuous wire may be accommodated on a bobbin having 65 rows of notched struts 216, an inside working diameter of 6 inches, an outside working diameter of 22 inches, and a working height of 22 inches.

Figure 5:
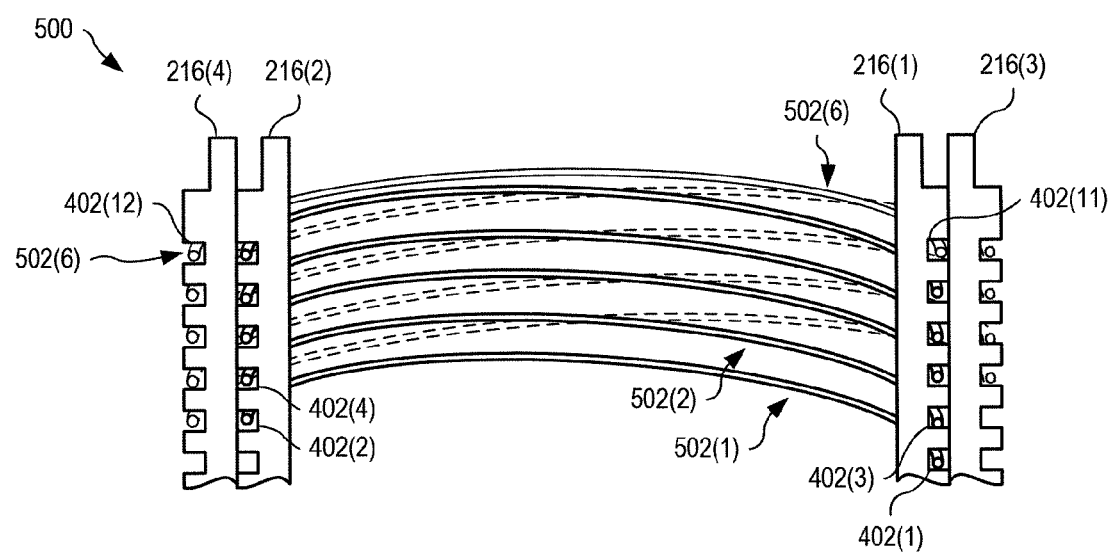
FIG. 5 is a schematic showing exemplary winding of the wire onto the notched struts of FIG. 2.

FIG. 5 is a schematic showing exemplary winding of wire 108 onto struts 216. Front facing and rear facing struts are omitted from FIG. 5 for clarity of illustration. A first turn 502(1) of wire 108 is shown passing from a notch 402(1) of strut 216(1) to a notch 402(2) of strut 216(2). A subsequent turn 502(2) of wire 108 passes through a notch 402(3) of strut 216(1) and through a notch 402(4) of strut 216(2). Turns of wire 108 are added until all notches 402 within each strut 216 are filled, whereupon a next set of struts 216 are added to bottom plate 212, adjacent to the filed struts. For example, as a turn 502(6) passes through top notch 402(11) of strut 216(1), a next strut 216(3) is added adjacent to strut 216(1) and a next strut 216(4) is added adjacent to strut 216(2). Turn 502(6) of wire 108 then passes through top notch 402(12) of newly added strut 216(4). Subsequent turns pass through the next lower notch 402 of each strut 216 until again, wire 108 passes through each notch once, whereupon a next set of struts 216 are added to bottom plate 212, adjacent to the filled struts.

Preferably, wire 108 lays centered within each notch 402, is not tensioned to be forced against the back part of any notch 402, and is not overly loose such that any turn 502 touches any other turn.

This process is repeated until all struts 216 are inserted in bottom plate 212 and all notches 402 contain one pass of wire 108. Threaded rods 214 are then screwed into holes 302 and top plate 210 is positioned and secured such that top spigots of struts 216 are positioned within slots of top plate 210 and threaded rods 214 are positioned within holes of top plate 210. Threaded rods are then secured within the hole of top plate 210 by four fasteners (e.g., threaded screws) and actuator 104 is secured to top plate 210.

This method permits a large continuous length of wire 108 to be strung in a small space (i.e., to fit within vacuum chamber 150). The length L of wire 108 which can be strung on bobbin 102 that has an winding height h, inner winding diameter $d_i$, an outer winding diameter $d_o$, notch 402 spacing s and strut 216 spacing w is given by the formula:

$$L = \frac{\pi h d_o^2 + d_i^2 - 4\pi h d_i^2 + 2\pi h d_o d_i}{2sw}$$

The bobbin 102 and actuator 104 assembly (with loaded wire 108) is then placed inside vacuum chamber 150 and actuator 104 is connected to controller 106 by electrical cable 110. Electrical cable 110 thus passes through a wall of vacuum chamber 150. Vacuum chamber 150 is then evacuated by vacuum pump 152 and then a vapor injector 154 injects a dielectric material 156, in vapor form, into vacuum chamber 150 for a coating period while actuator 104, under control of controller 106, vibrates bobbin 102 such that wire 108 has minimal contract with struts 216. Actuator 104 may impart a vertical vibration to bobbin 102 such that struts 216 impart momentary forces to each turn of wire 108, there by levitating them away from surfaces of notches 402.

During the coating period, dielectric material 156 coats all surfaces within vacuum chamber 150, thereby coating wire 108. The coating period is selected based upon the coating rate of dielectric material 156 and the desired thickness of the coating to be applied to wire 108.

Upon termination of the coating period, controller 106 stops vibration of bobbin 102, the vacuum within vacuum chamber 150 is released and bobbin 102, actuator 104, and wire 108 are removed from vacuum chamber 150. Wire 108, now coated with dielectric material 156, may be removed from bobbin 102 in a process that is substantially the reverse of the winding process described above, once actuator 104, top plate 210 and threaded rods 214 are removed.

Figure 6:
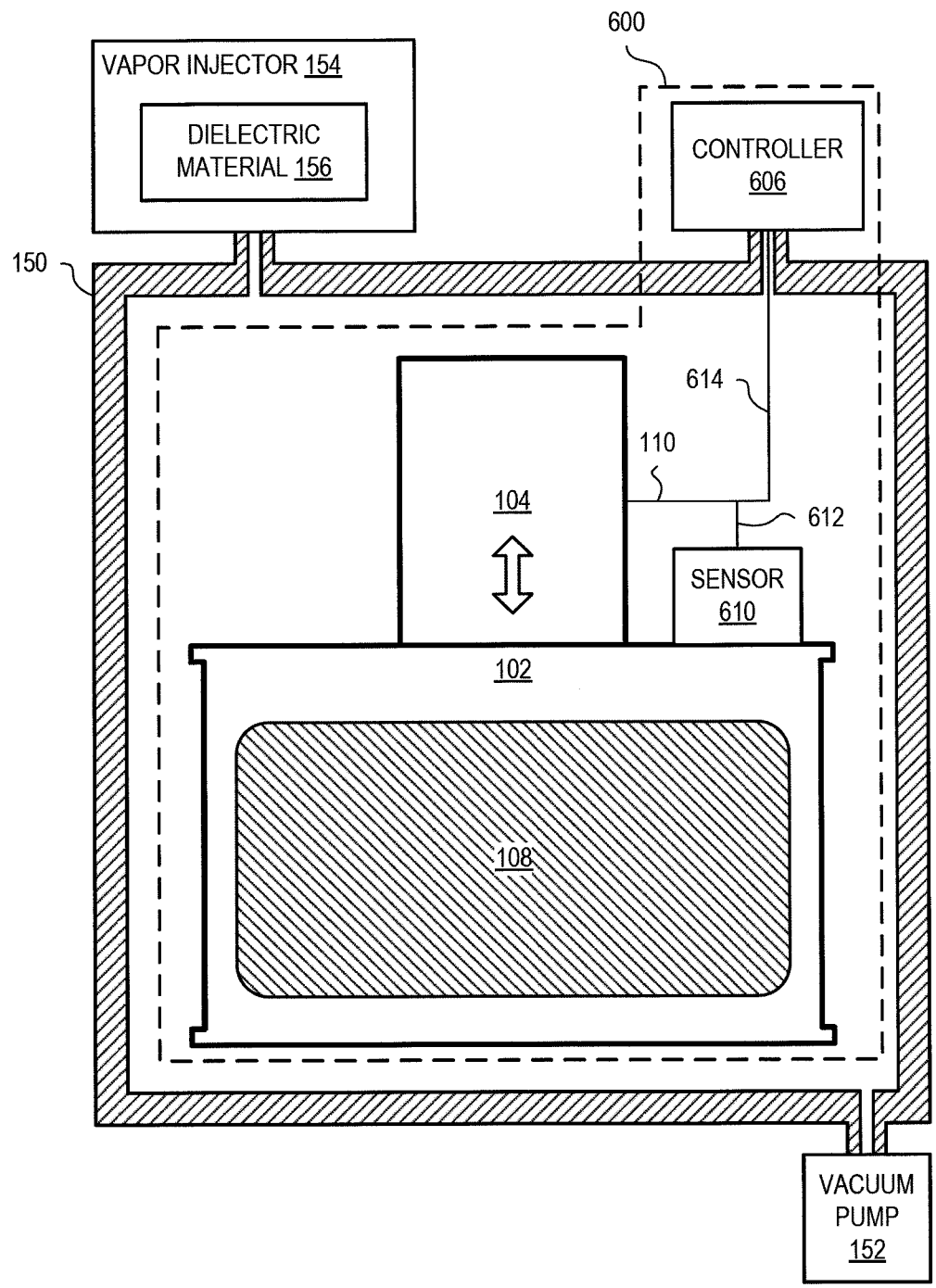
FIG. 6 shows one exemplary dielectric coating apparatus, similar to the apparatus of FIG. 1, but further including a sensor for monitoring vibration of the bobbin, in an embodiment.

FIG. 6 shows one exemplary apparatus 600 for facilitating vapor deposition of dielectric material 156 onto wire 108 within vacuum chamber 150. Apparatus 600 is similar to apparatus 100 of FIG. 1, but further includes a sensor 610 connected to a controller 606, via a cable 612, for monitoring vibration of bobbin 102. Sensor 610 is mechanically coupled with top plate 210, FIG. 2, of bobbin 102 and senses vibration of bobbin 102 imparted by actuator 104. Controller 606 is similar to controller 106 of FIG. 1, except that feedback from sensor 610 is used to control one or more of frequency, amplitude and waveform of signals driving, via connector 110, actuator 104 such that contact between wire 108 and bobbin 102 is minimized for the coating period.

Figure 7:
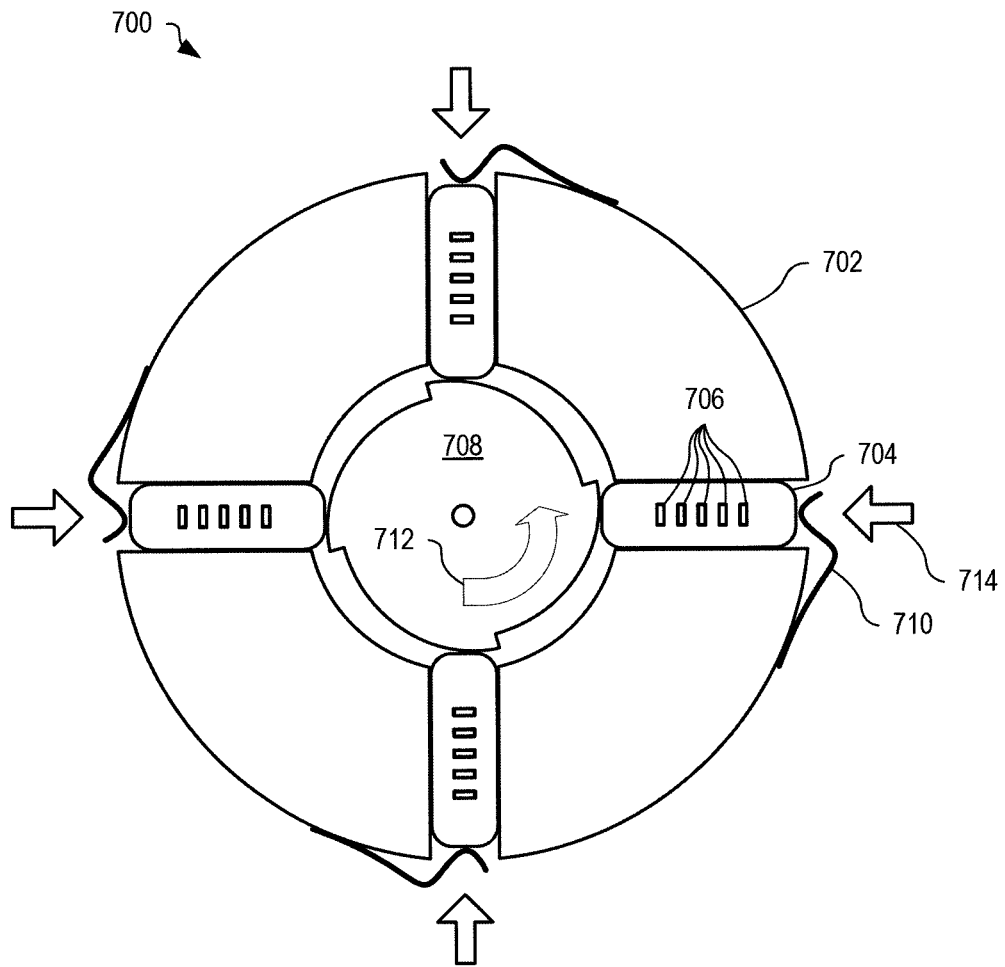
FIG. 7 shows one exemplary plate with sliders that move slots radially with respect to plate to reduce tension on the wire after winding, in an embodiment.

In an alternate embodiment of top plate 210 and bottom plate 212, slots 304 are movable such that any tension imparted to wire 108 during winding of wire 108 into bobbin 102 may be removed. FIG. 7 shows one exemplary plate 700 with sliders 704 that move slots 706 radially with respect to plate 700. The position of sliders 704 are maintained by a cam 708 that pushes slider 704 against a spring 710. As cam 708 rotates counter clockwise, as indicated by arrow 712, slider 704 is moved inward by spring 710, as indicated by arrow 714. Plate 700 may replace each of plates 210 and 212 within bobbin 102.

In one example of operation, prior to winding wire onto bobbin 102, cam 708 is positioned such that sliders 704 extend maximally outward from a center of plate 702. Wire 108 is then wound onto bobbin 102, as described above, and another plate 702 is positioned as top plate (e.g., top plate 210) of bobbin 102. Cams 708 of both top and bottom plates of bobbin 102 are then rotated to release tension on wire 108 and then secured in position. Bobbin 102 and actuator 104 are positioned within vacuum chamber 150 for deposition of dielectric material 156 as a coating on wire 108, as described above. Other mechanisms for moving slots 304 may be used without departing from the scope hereof.

Figure 9:
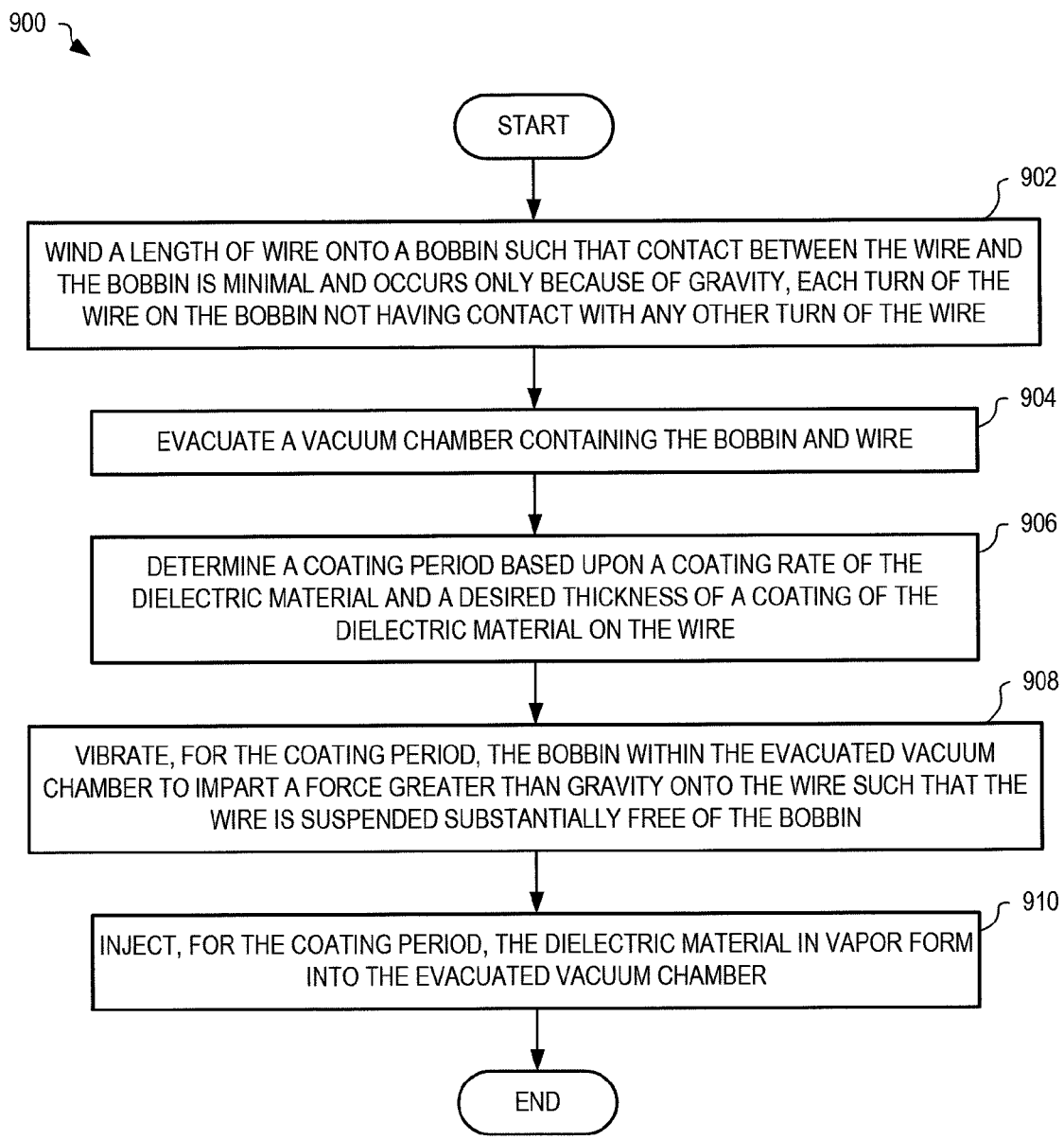
FIG. 9 shows one exemplary method for coating a length of wire with a vacuum deposited dielectric material, in an embodiment.

FIG. 9 shows one exemplary method 900 for coating a length of wire with a vacuum deposited dielectric material. In step 902, method 900 winds the length of wire onto a bobbin such that contact between the wire and the bobbin is minimal and occurs only because of gravity, each turn of the wire on the bobbin not having contact with any other turn of the wire. In one example of step 902, wire 108 is wound onto bobbin 102 based upon method 800, FIG. 8.

In step 904, method 900 evacuates a vacuum chamber containing the bobbin and wire. In one example of step 904, bobbin 102, wound with wire 108 and attached to actuator 104, is placed into vacuum chamber 150, which is then evacuated by vacuum pump 152.

In step 906, method 900 determines a coating period based upon a coating rate of the dielectric material and a desired thickness of a coating of the dielectric material on the wire. In one example of step 906, a coating period of 6 hours is determined for the dielectric material Parylene HT to provide a coating thickness of 3-5 micron (0.00012-0.0002 inches).

In step 908, method 900 vibrates, for the coating period, the bobbin within the evacuated vacuum chamber to impart a force greater than gravity onto the wire such that the wire is suspended substantially free of the bobbin. In one example of step 908, controller 106 drives actuator 104 to impart a vibration onto bobbin 102 with an amplitude greater than 1 g such that wire 108 is suspended substantially free of bobbin 102.

In step 910, method 900 injects, for the coating period, the dielectric material in vapor form into the evacuated vacuum chamber. In one example of step 910, vapor injector 154 injects dielectric material 156, in vapor form, into vacuum chamber 150 for the duration of the coating period such that the dielectric material coats the length of wire substantially continuously at the desired thickness.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

Figure 10:
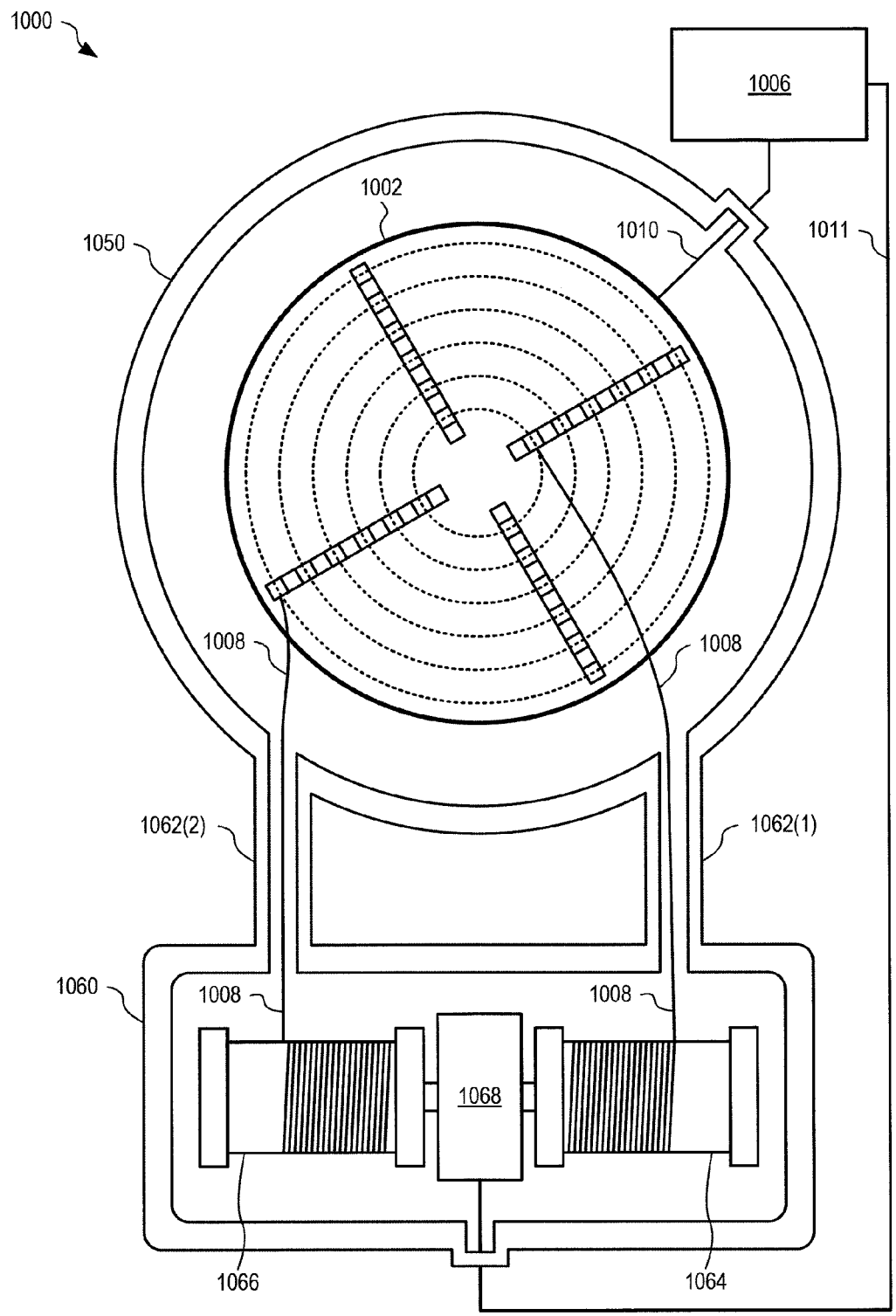
FIG. 10 shows one exemplary apparatus for facilitating vapor deposition of a dielectric material onto a wire within a vacuum chamber, in an embodiment.

FIG. 10 shows one exemplary apparatus 1000 for facilitating vapor deposition of a dielectric material onto a wire 1008 within a vacuum chamber 1050. Apparatus 1000 is similar to apparatus 100 of FIG. 1, and includes a vacuum pump, and vapor injector that are not show for clarity of illustration. Vacuum chamber 1050 may represent any one of a LABCOTER® Parylene Deposition System, a PDS 2060PC Deposition System, and a PDS 2035CR Deposition System, made by Specialty Coating Systems of Indiana, or any other such vacuum chamber suitable for vapor deposition of a dielectric material.

Vacuum chamber 1050 is for example cylindrical with an internal diameter of 12 inches and an internal length of 12 inches. Vacuum chamber 1050 may be formed in other shapes and have other sizes without departing from the scope hereof. Wire 1008 is loosely spooled onto a bobbin 1002 such that each turn of wire 1008 does not contact any other turn of wire 1008. Wire 1008 is similar to wire 108, and bobbin 1002 is similar to bobbin 102.

Bobbin 1002 is mechanically attached to an actuator that connects, via an electrical connection 1010, to a controller 1006. Controller 1006 may include a processor, memory and controlling software. The actuator is not shown and is similar to actuator 104 of apparatus 100. Similar to apparatus 100, controller 1006 drives the actuator to impart a vibration to bobbin 1002 such that spooled wire 1008 has only momentary physical contact with bobbin 1002. The dielectric material is injected into vacuum chamber 1050 by an injector (not shown for clarity of illustration) that is similar to vapor injector 154 of apparatus 100, such that the dielectric material is deposited onto wire 1008. The dielectric material is similar to dielectric material 156.

Apparatus 1000 also includes a second vacuum chamber 1060 that connects to vacuum chamber 1050 via a wire inlet tube 1062(1) and a wire outlet tube 1062(2). Tubes 1062 have a very small internal diameter and relatively long length (e.g., a length to internal diameter ratio greater than 30) that minimize transfer of the dielectric material from vacuum chambers 1050 to second vacuum chamber 1060. Specifically, any dielectric material that passes into tubes 1062 would be deposited onto the inner surface of these tubes, rather than pass into second vacuum chamber 1060.

Second vacuum chamber 1060 contains a wire feed reel 1064 and a wire take-up reel 1066 that are each individually actuated by a spooling mechanism 1068. spooling mechanism 1068 is also controlled by controller 1006 via an electrical connection 1011, for example. In one embodiment, each reel 1064, 1066 is mounted on a shaft that is driven by spooling mechanism 1068. Spooling mechanism 1068 for example includes two motor drives that operate, under control of controller 1006, to turn reels 1064 and 1066 to transfer wire 1008 from wire feed reel 1064, through tube 1062(1) onto bobbin 1002, and from bobbin 1002, through tube 1062(2) and onto take-up reel 1066. Spooling mechanism 1068 may include sensors for sensing tension on wire 1008, and/or one or more tensioning devices that facilitate passage of wire 1008 through tubes 1062 and bobbin 1002. Since reels 1064, 1066 are located within vacuum chamber 1060 that is fluidly connected to vacuum chamber 1050, there is no need for complicated seals to allow wire 1008 to in and out of vacuum chamber 1050.

To coat wire 1008 within vacuum chamber 1050, bobbin 1002 is vibrated (in a way similar to bobbin 102 of apparatus 100) such that coils of wire 1008 wound onto bobbin 1002 have minimal contact with bobbin 1002 and with other coils of wire 1008. This minimal contact also minimizes friction between wire 1008 and surfaces of bobbin 1002 such that spooling mechanism 1068, using carefully adjusted tension on wire feed reel 1064 and wire take-up reel 1066, may move coated wire 1008 from bobbin 1002 to wire take-up reel 1066, and move uncoated wire 1008 from wire feed reel 1064 onto bobbin 1002. The use of second vacuum chamber 1060 and reels 1064, 1066 allow greater lengths of wire to be coated for each pump-down of vacuum chambers 1050 and 1060.

In one example of operation, a first length of wire 1008 is spooled onto bobbin 1002 and coated with dielectric material within vacuum chamber 1050. Spooling mechanism 1068 then transfers the coated portion of wire 1008 from bobbin 1002 to take-up spool 1066, while simultaneously feeding uncoated wire 1008 from wire feed spool 1064 onto bobbin 1002. When all coated wire is off of bobbin 1002, spooling mechanism stops to allow this next portion of wire 1008 to be coated by the dielectric material. This process repeats until all wire from wire feed spool 1064 has been coated and transferred onto wire take-up spool 1066.

In one embodiment, spooling mechanism 1068 continually moves wire 1008 through bobbin 1002 at a speed such that each portion of wire 1008 spends the desired coating period within vacuum chamber 1050. Such process has additional advantages in that the continually moving wire 1008 is more evenly coated than when wire 1008 is not spooled during the coating process. For example, even if wire were to contact a portion of bobbin 1002, since wire 1008 is continually moving, no one portion of wire 1008 remains in contact with bobbin 1002 for the entire duration of the coating process, and coating problems are thereby reduced.

In one embodiment, bobbin 1002 is configured with a plurality of cam points that guide a first end of wire 1008 to facilitate self threading of wire 1008 onto bobbin 1002. For example, each notch (e.g., notches 402, FIG. 4) of bobbin 1008 may include a cam point that directs the first end of wire 1008 towards a next notch of bobbin 1002 to receive wire 1008. In one embodiment, one or more notches of bobbin 1002 include a ceramic fish spine bead that has an inside surface forming a cam point to guiding wire 1008 around bobbin 1002 to facilitate self threading without plastic deformation or buckling of wire 1008.

Orientation of wire feed reel 1064 relative to orientation of bobbin 1002 may also be selected to take advantage of the curvature induced into wire 1008 when wound onto reel 1064. For example, within vacuum chamber 1060, reel 1064 may be oriented in a similar direction to the path of wire 1008 through bobbin 1002, wherein the curvature within wire 1008 facilitates self threading of wire 1008 through bobbin 1002. Further, the position and orientation of tubes 1062(1) and (2) may be configured to align with a desired path of wire 1008 to and from bobbin 1002 within vacuum chamber 1050.

Figure 11:
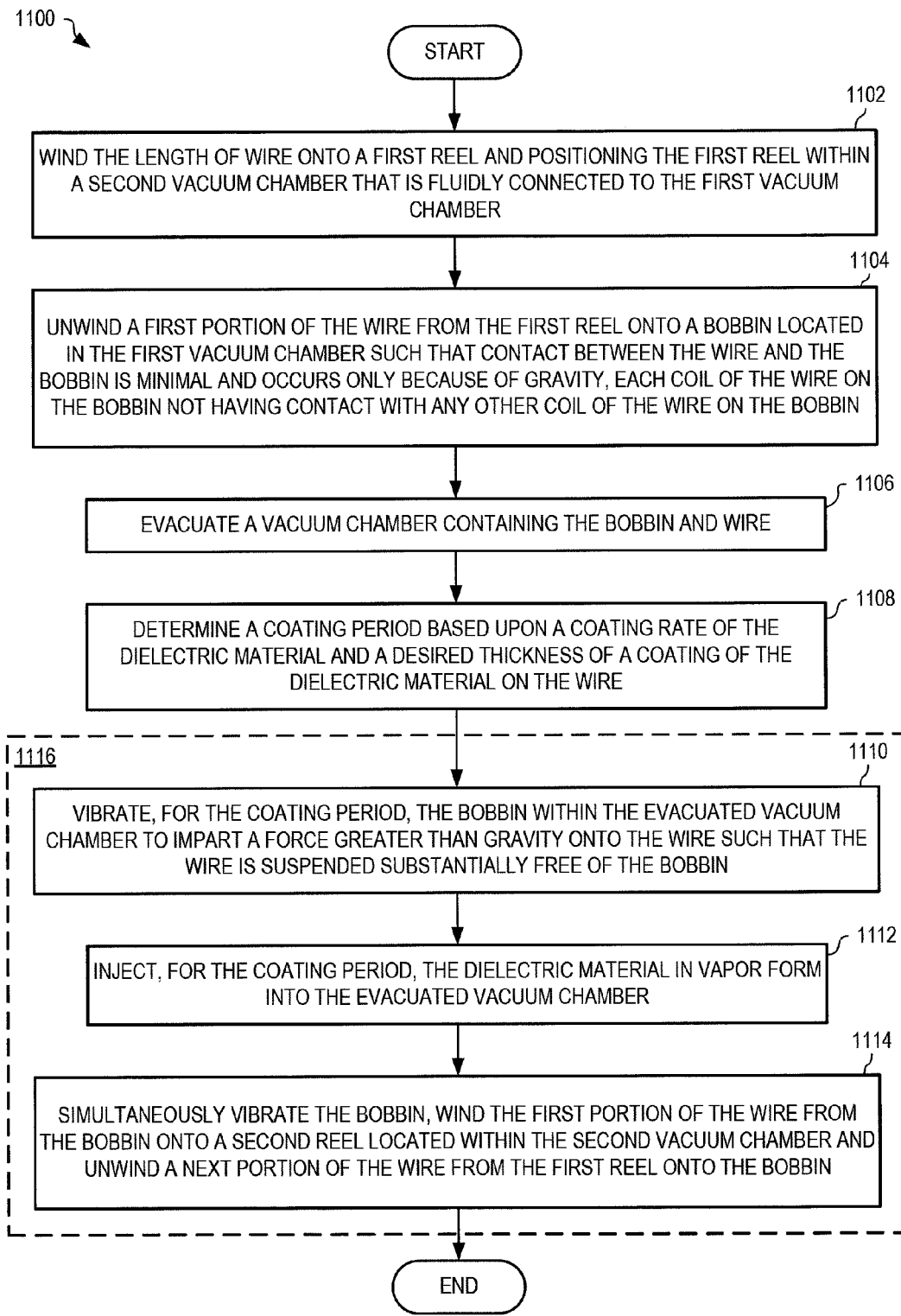
FIG. 11 is a flowchart illustrating one exemplary method for coating a length of wire with a dielectric material within a first vacuum chamber, in an embodiment.

FIG. 11 is a flowchart illustrating one exemplary method 1100 for coating a length of wire with a dielectric material within a first vacuum chamber. For example, method 1100 is implemented within controller 1006 of apparatus 1000 of FIG. 10 to coat a length of wire 1008. In step 1102, method 1100 winds the length of wire onto a first reel and positions the first reel within a second vacuum chamber that is fluidly connected to the first vacuum chamber. In one example of step 1102, wire 1008 is wound onto wire feed reel 1064, which is then positioned within vacuum chamber 1060. In step 1104, method 1100 unwinds a first portion of the wire from the first reel onto a bobbin located in the first vacuum chamber such that contact between the wire and the bobbin is minimal and occurs only because of gravity and not because of tension on wire 1008, each coil of the wire on the bobbin not having contact with any other coil of the wire on the bobbin. In one example of step 1104, a first end of wire 1008 is fed through tube 1062(1) and onto bobbin 1002 within vacuum chamber 1050. In step 1106, method 1100 evacuates the first and second vacuum chambers. In one example of step 1106, vacuum chambers 1050 and 1060 are closed and a vacuum pump (e.g., vacuum pump 152, FIG. 1) is engaged to evacuate vacuum chambers 1050 and 1060.

In step 1108, method 1100 determines a coating period based upon a coating rate of the dielectric material and a desired thickness of a coating of the dielectric material on the wire. In one example of step 1108, based upon a deposition rate of the dielectric material and a selected coating thickness 4 micron, a coating period of 6 hours is determined for the dielectric material Parylene HT to provide a coating thickness of 3-5 micron (0.00012-0.0002 inches) on wire 1008. In step 1110, method 1100 vibrates, for the coating period, the bobbin within the evacuated vacuum chamber to impart a force greater than gravity onto the wire such that the wire is suspended substantially free of the bobbin. In one example of step 1110, a controller (e.g., controller 106) drives an actuator (e.g., actuator 104) to impart a vibration onto bobbin 1002 with an amplitude greater than 1 g such that wire 1008 is suspended substantially free of bobbin 1002.

In step 1112, method 1100 injects, for the coating period, the dielectric material in vapor form into the evacuated vacuum chamber such that the dielectric material forms a substantially continuous coating on the length of wire at the desired thickness. In one example of step 1112, a vapor injector (e.g., vapor injector 154) injects a dielectric material (e.g., dielectric material 156), in vapor form, into vacuum chamber 1050 for the duration of the coating period such that the dielectric material coats the portion of wire 1008 substantially continuously at the desired thickness.

In step 1114, method 1100 simultaneously vibrates the bobbin, winds the first portion of the wire from the bobbin onto a second reel located within the second vacuum chamber, and unwinds a next portion of the wire from the first reel onto the bobbin. In one example of step 1114, spooling mechanism 1068 controls motion of reels 1064 and 1068 to wind a portion of coated wire 1008 from bobbin 1002 onto reel 1066 and to unwind a next portion of wire 1008 from reel 1064 onto bobbin 1002, while bobbin 1002 is being vibrated to reduce friction of wire 1008 against bobbin 1002.

Steps 1110 through 1114 repeat, as indicated by dashed outline 1116, until the entire length of wire 1008 is coated. The combination of vibrating bobbin 1002 and spooling wire from a second vacuum chamber 1060 into a first vacuum chamber 1050 allows longer lengths of wire to be coated without the need to release and recreate the vacuum within chamber 1050 and 1060.

Changes may be made in the above methods and systems without departing from the scope hereof. For example, although the processes was developed to coat copper magnet wire with Parylene HT, other types of coating and wire materials may be used without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A system for suspending a length of wire substantially in free space within a vacuum chamber to deposit a dielectric material onto the entire outer surface of the wire by vapor deposition, comprising:
   a vacuum chamber;
   a controller;
   a bobbin located within the vacuum chamber, comprising:
     a top plate having a plurality of slots,
     a bottom plate having a plurality of slots,
     a plurality of notched struts having a spigot formed at each end, where a first spigot is inserted into one slot of the top plate and the other spigot is inserted into an associated slot of the bottom plate such that the notches are facing outwards away from a center of the bobbin,
     a plurality of threaded rods for securing the top plate to the bottom plate; and
   an actuator mechanically coupled with the top plate and electrically coupled to the controller;
   wherein the controller is configured to drive the actuator to vibrate the bobbin within the vacuum chamber such that the wire wound around the bobbin and passing through the notches is intermittently suspended in the free space and the entire outer surface of the wire is coated by vapor deposition.

2. The system of claim 1, further comprising a sensor mechanically coupled to the bobbin and electrically coupled to the controller for sensing vibration of the bobbin and providing feedback to the controller such that the actuator may be controlled to impart, to the wire, sufficient acceleration to overcome gravitational force exerted on the wire, thereby substantially suspending the wire in free space.

3. The system of claim 1, further comprising a mechanism for moving the struts radially with respect to the bobbin to remove any tension on the wire wound onto the bobbin.

4. The system of claim 3, the mechanism forming part of the top and bottom plates.

5. The system of claim 1, wherein the dielectric material is selected from the group consisting of: Parylene C, Parylene CF, Parylene D, Parylene HT, Parylene N, Parylene SF, and Parylene SR.

6. The system of claim 1,
the vacuum chamber comprising
a first vacuum chamber, and
a second vacuum chamber fluidly connected to the first vacuum chamber by a first and second tube, a first and second reel located within the second vacuum chamber, the first reel storing an uncoated portion of the wire and the second reel storing a coated portion of the wire;
wherein the bobbin is located within the first vacuum chamber.

7. The system of claim 6 further including one or more of:
a vacuum pump for evacuating the first and second vacuum chambers to a pressure less than 0.1 Torr;
a vapor injector for injecting the dielectric material into the first vacuum chamber to coat coils of the wire wound onto the bobbin; and
a spooling mechanism for independently rotating the first and second reels to move the wire from the first reel, through the bobbin, and onto the second reel.

8. The system of claim 7, the bobbin suspending a portion of the wire substantially in free space within the first vacuum chamber to deposit a dielectric material onto substantially the entire outer surface of the portion of wire by vapor deposition.

9. The system of claim 7, the spooling mechanism for continually moving the wire through the bobbin at a speed such that the wire is evenly coated with the dielectric material.

* * * * *